US010665799B2

(12) United States Patent
Farmer et al.

(10) Patent No.: US 10,665,799 B2
(45) Date of Patent: May 26, 2020

(54) N-TYPE END-BONDED METAL CONTACTS FOR CARBON NANOTUBE TRANSISTORS

(71) Applicant: International Business Machines Corporation, Armonk, NY (US)

(72) Inventors: Damon B. Farmer, White Plains, NY (US); Shu-Jen Han, Cortlandt Manor, NY (US); Jianshi Tang, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 15/210,491

(22) Filed: Jul. 14, 2016

(65) Prior Publication Data
US 2018/0019420 A1 Jan. 18, 2018

(51) Int. Cl.
H01L 29/06 (2006.01)
H01L 51/10 (2006.01)
H01L 51/00 (2006.01)
H01L 51/05 (2006.01)

(52) U.S. Cl.
CPC ........ H01L 51/105 (2013.01); H01L 51/0026 (2013.01); H01L 51/0048 (2013.01); H01L 51/0545 (2013.01); H01L 51/107 (2013.01); H01L 51/0558 (2013.01); H01L 2251/301 (2013.01); H01L 2251/303 (2013.01)

(58) Field of Classification Search
CPC .................. H01L 21/02606; H01L 29/0669
USPC ................ 438/149, 154, 164, 199; 977/938; 257/29
See application file for complete search history.

(56) References Cited

U.S. PATENT DOCUMENTS

| 6,706,566 B2* | 3/2004 | Avouris ................. B82Y 10/00 438/105 |
| 6,723,624 B2 | 4/2004 | Wang et al. |
| 6,891,227 B2* | 5/2005 | Appenzeller .......... B82Y 10/00 257/346 |
| 6,933,222 B2* | 8/2005 | Dubin .................... B82Y 10/00 257/E21.404 |

(Continued)

OTHER PUBLICATIONS

Che et al., "Review of carbon nanotube nanoelectronics and macroelectronics", Semiconductor Science and Technology 29 (2014) 073001.*

(Continued)

Primary Examiner — Jay C Kim
(74) Attorney, Agent, or Firm — Vazken Alexanian; Ryan, Mason & Lewis, LLP

(57) ABSTRACT

A method for manufacturing a semiconductor device includes forming a first dielectric layer on a substrate, forming a carbon nanotube (CNT) layer on the first dielectric layer, forming a second dielectric layer on the carbon nanotube (CNT) layer, patterning a plurality of trenches in the second dielectric layer exposing corresponding portions of the carbon nanotube (CNT) layer, forming a plurality of contacts respectively in the plurality of trenches on the exposed portions of the carbon nanotube (CNT) layer, performing a thermal annealing process to create end-bonds between the plurality of the contacts and the carbon nanotube (CNT) layer, and depositing a passivation layer on the plurality of the contacts and the second dielectric layer.

14 Claims, 4 Drawing Sheets

(56) References Cited

U.S. PATENT DOCUMENTS

| | | | | |
|---|---|---|---|---|
| 7,076,871 B2* | 7/2006 | Horiuchi | B82Y 10/00 204/192.38 |
| 7,141,727 B1* | 11/2006 | Appenzeller | B82Y 10/00 257/20 |
| 7,233,071 B2* | 6/2007 | Furukawa | B82Y 10/00 257/759 |
| 7,253,065 B2 | 8/2007 | Appenzeller et al. | |
| 7,253,431 B2* | 8/2007 | Afzali-Ardakani | B82Y 10/00 257/20 |
| 7,492,015 B2* | 2/2009 | Chen | B82Y 10/00 257/369 |
| 7,598,516 B2 | 10/2009 | Avouris et al. | |
| 7,714,386 B2 | 5/2010 | Pesetski et al. | |
| 7,732,859 B2* | 6/2010 | Anderson | H01L 29/1606 257/328 |
| 7,786,024 B2* | 8/2010 | Stumbo | B23K 26/073 438/795 |
| 7,786,466 B2* | 8/2010 | Appenzeller | B82Y 10/00 257/14 |
| 7,847,588 B2 | 12/2010 | Bertin | |
| 7,897,960 B2* | 3/2011 | Appenzeller | B82Y 10/00 257/24 |
| 8,004,043 B2* | 8/2011 | Keshavarzi | B82Y 10/00 257/369 |
| 8,022,725 B2* | 9/2011 | Kim | B82Y 10/00 326/49 |
| 8,063,451 B2* | 11/2011 | Zhang | B82Y 10/00 257/330 |
| 8,120,008 B2* | 2/2012 | Peng | B82Y 10/00 257/10 |
| 8,227,799 B2* | 7/2012 | Liu | B82Y 10/00 257/288 |
| 8,288,759 B2* | 10/2012 | Chen | B82Y 10/00 257/24 |
| 8,288,804 B2* | 10/2012 | Kikuchi | B82Y 10/00 257/288 |
| 8,297,351 B2* | 10/2012 | Yoshiuchi | B82Y 10/00 166/250.01 |
| 8,354,291 B2* | 1/2013 | Zhou | B82Y 10/00 257/E21.009 |
| 8,362,525 B2* | 1/2013 | Bertin | B82Y 10/00 257/213 |
| 8,420,474 B1* | 4/2013 | Frank | H01L 27/1203 438/155 |
| 8,445,893 B2* | 5/2013 | Meric | H01L 29/1606 257/29 |
| 8,471,249 B2 | 6/2013 | Chiu et al. | |
| 8,487,297 B2 | 7/2013 | Subagyo et al. | |
| 8,502,277 B2* | 8/2013 | Matsumoto | B82Y 10/00 257/213 |
| 8,580,586 B2 | 11/2013 | Bertin et al. | |
| 8,609,481 B1* | 12/2013 | Franklin | H01L 51/055 438/197 |
| 8,610,125 B2* | 12/2013 | Kastalsky | H01L 33/04 257/13 |
| 8,610,989 B2* | 12/2013 | Avouris | H01L 31/0352 257/428 |
| 8,617,941 B2* | 12/2013 | Farmer | H01L 29/1606 257/27 |
| 8,796,096 B2* | 8/2014 | Farmer | H01L 29/1606 216/81 |
| 8,901,666 B1* | 12/2014 | Meade | H01L 29/1606 257/369 |
| 8,969,118 B2* | 3/2015 | Afzali-Ardakani | B82Y 30/00 257/E21.442 |
| 9,040,364 B2* | 5/2015 | Farmer | H01L 21/02603 257/E51.04 |
| 9,082,856 B2* | 7/2015 | Chen | H01L 29/4908 |
| 9,177,688 B2* | 11/2015 | Bol | H01L 51/0048 |
| 9,287,516 B2* | 3/2016 | Cao | H01L 51/0541 |
| 9,299,939 B1* | 3/2016 | Cao | H01L 51/105 |
| 9,543,535 B1* | 1/2017 | Afzali-Ardakani | H01L 51/0516 |
| 9,577,204 B1* | 2/2017 | Han | H01L 51/0558 |
| 9,882,008 B2* | 1/2018 | Colombo | H01L 29/401 |
| 10,396,300 B2* | 8/2019 | Han | H01L 27/288 |
| 2004/0238887 A1* | 12/2004 | Nihey | B82Y 10/00 257/347 |
| 2005/0224888 A1* | 10/2005 | Graham | B82Y 10/00 257/368 |
| 2012/0280213 A1* | 11/2012 | Gau | H01L 51/0048 257/29 |
| 2015/0348667 A1* | 12/2015 | Bol | H01L 51/0048 428/408 |
| 2017/0133609 A1* | 5/2017 | Cao | H01L 51/105 |

OTHER PUBLICATIONS

Grigoras et al., "Atomic Layer Deposition of Aluminum Oxide Films for Carbon Nanotube Network Transistor Passivation", Journal of Nanoscience and Nanotechnology 11 (2011) pp. 8818-8825.*

Kim et al., "Controlling the electronic properties of SWCNT FETs via modification of the substrate surface prior to atomic layer deposition of 10 nm thick Al2O3 film", Nanotechnology 24 (2013) 455701.*

Young et al., "Growth and Characterization of Al2O3 Atomic Layer Deposition Films on sp2-Graphitic Carbon Substrates Using NO2/ Trimethylaluminum Pretreatment", Applied Materials & Interfaces 7 (2015) pp. 12030-12037.*

Wang et al., "Carbon nanotube electronics—moving forward", Chemical Society Review 42 (2013) pp. 2592-2609.*

Zavodchikova et al., "Carbon nanotube thin film transistors based on aerosol methods", Nanotechnology 20 (2009) 085201.*

Helbling et al., "Long term investigations of carbon nanotube transistors encapsulated by atomic-layer-deposited Al2O3 for sensor applications", Nanotechnology 20 (2009) 434010.*

Javey et al., "Carbon Nanotube Field-Effect Transistors with Integrated Ohmic Contacts and High-k Gate Dielectrics", Nano Letters 4 (2004) pp. 447-450.*

Rodriguez-Manzo et al., "Heterojunctions between metals and carbon nanotubes as ultimate nanocontacts", PNAS 106 (2009), pp. 4591-4595.*

"IBM Reports Carbon Nanotube Transistor Breakthrough", www.hpcwire.com (2015).*

Cao et al., "End-bonded contacts for carbon nanotube transistors with low, size-independent resistance", Science 350 (2015) pp. 68-72.*

"Fundamental Physical Aspects of Carbon Nanotube Transistors", a chapter of the book entitled "Carbon Nanotubes" edited by Jose Mauricio Marulanda (2010).*

Schroter et al., "Carbon Nanotube FET Technology for Radio-Frequency Electronics: State-of-the-Art Overview", IEEE Journal of the Electron Devices Society 1 (2013) pp. 9-20.*

Leonard et al., "Electrical contacts to one- and two-dimensional nanomaterials", Nature Nanotechnology 6 (2011) pp. 773-783.*

Misewich et al., "Electrically Induced Optical Emission from a Carbon Nanotube FET", Science 300 (2003) pp. 783-786.*

Banhart, "Interactions between metals and carbon nanotubes: at the interface between old and new materials," Nanoscale 1 (2009) pp. 201-213.*

Cha et al., "Three-Dimensional Imaging of Carbon Nanotubes Deformed by Metal Islands," Nano Letters 7 (2007) pp. 3770-3773.*

Perebeinos et al., "Carbon Nanotube Deformation and Collapse under Metal Contacts," Nano Letters 14 (2014) pp. 4376-4380.*

Q. Cao et al., "End-Bonded Contacts for Carbon Nanotube Transistors with Low, Size-Independent Resistance," Science, Oct. 2015, pp. 68-72, vol. 350, No. 6256.

Y. Zhang et al., "Heterostructures of Single-Walled Carbon Nanotubes and Carbide Nanorods," Science, Sep. 1999, pp. 1719-1722, vol. 285, No. 5434.

T.-J. Ha et al., "Highly Uniform and Stable N-Type Carbon Nanotube Transistors by Using Positively Charged Silicon Nitride Thin Films," Nano Letters, Jan. 2015, pp. 392-397, vol. 15, No. 1.

(56) References Cited

OTHER PUBLICATIONS

Z. Zhang et al., "Reverse Degradation of Nickel Graphene Junction by Hydrogen Annealing," AIP Advances, Jan. 2016, pp. 1-7, vol. 6.
U.S. Appl. No. 14/933,339 filed in the name of Q. Cao et al. on Nov. 5, 2015 and entitled "End-Bonded Metal Contacts on Carbon Nanotubes."
U.S. Appl. No. 14/957,664 filed in the name of S.-J. Han et al. on Dec. 3, 2015 and entitled "Carbon Nanotube Device with N-Type End-Bonded Metal Contacts."
List of IBM Patents or Patent Applications Treated as Related.

\* cited by examiner

WITH PASSIVATION

WITHOUT PASSIVATION

N-TYPE END-BONDED METAL CONTACTS FOR CARBON NANOTUBE TRANSISTORS

CROSS-REFERENCE TO RELATED APPLICATION

This application is related to U.S. patent application Ser. No. 15/210,463, filed on Jul. 14, 2016, which is commonly assigned, and entitled "Carbon Nanotube Transistor And Logic With End-Bonded Metal Contacts", the complete disclosure of which is expressly incorporated herein by reference in its entirety for all purposes.

TECHNICAL FIELD

The field generally relates to semiconductor devices and methods of manufacturing same and, in particular, to forming n-type end-bonded metal contacts to carbon nanotubes (CNTs).

BACKGROUND

A metal-oxide-semiconductor field-effect transistor (MOSFET) is a transistor used for amplifying or switching electronic signals, and includes a metal oxide gate electrode. N-type field effect transistors (NFETs) and p-type field effect transistors (PFETs) are two types of complementary MOSFETs. An NFET includes n-doped source/drain regions and utilizes electrons as current carriers, whereas a PFET includes p-doped source/drain regions and uses holes as current carriers.

Complementary metal-oxide semiconductor (CMOS) technology is being continuously scaled down with respect to device channel length and contact length. As the channel length reaches tens of nanometers, contact resistance can become comparable with channel resistance, and gradually limit transistor drive current.

Due to its superior electrical properties and intrinsic ultra-thin body, carbon nanotube (CNT) is widely considered as one of the most promising candidates to replace silicon for sub-5 nm technology nodes. CNT-based CMOS technology requires a scalable transistor channel and scalable and robust source/drain contacts for both PFETs and NFETs. For this purpose, end-bonded source/drain metal contacts to CNTs, featuring a length-independent contact resistance, represent a preferred contact scheme over side contacts for scaled technology nodes.

SUMMARY

According to an exemplary embodiment of the present invention, a method for manufacturing a semiconductor device includes forming a first dielectric layer on a substrate, forming a carbon nanotube (CNT) layer on the first dielectric layer, forming a second dielectric layer on the carbon nanotube (CNT) layer, patterning a plurality of trenches in the second dielectric layer exposing corresponding portions of the carbon nanotube (CNT) layer, forming a plurality of contacts respectively in the plurality of trenches on the exposed portions of the carbon nanotube (CNT) layer, performing a thermal annealing process to create end-bonds between the plurality of the contacts and the carbon nanotube (CNT) layer, and depositing a passivation layer on the plurality of the contacts and the second dielectric layer.

According to an exemplary embodiment of the present invention, a semiconductor device includes a first dielectric layer on a substrate, a carbon nanotube (CNT) layer on the first dielectric layer, a second dielectric layer on the carbon nanotube (CNT) layer, a plurality of contacts end-bonded to the carbon nanotube (CNT) layer, wherein the plurality of the contacts are positioned in a plurality of trenches in the second dielectric layer, and a passivation layer on the plurality of the contacts and the second dielectric layer.

According to an exemplary embodiment of the present invention, a method for manufacturing a semiconductor device includes forming a first dielectric layer on a substrate, forming a carbon nanotube (CNT) layer on the first dielectric layer, forming a second dielectric layer on the carbon nanotube (CNT) layer, patterning a plurality of trenches in the second dielectric layer exposing corresponding portions of the carbon nanotube (CNT) layer, forming a plurality of p-type contacts respectively in the plurality of trenches on the exposed portions of the carbon nanotube (CNT) layer, performing a thermal annealing process to create end-bonds between the plurality of the p-type contacts and the carbon nanotube (CNT) layer, and depositing a passivation layer on the plurality of the p-type contacts and the second dielectric layer, wherein the plurality of the p-type contacts are converted to n-type contacts.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
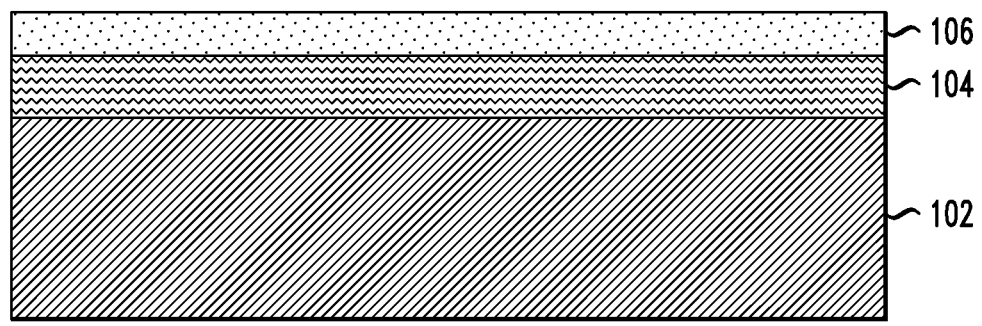
FIG. 1 is a cross-sectional view illustrating a carbon nanotube (CNT) layer on a dielectric layer on a substrate in a method for manufacturing a semiconductor device, according to an exemplary embodiment of the present invention.

Exemplary embodiments of the invention will now be discussed in further detail with regard to semiconductor devices and methods of manufacturing same and, in particular, to forming n-type end-bonded metal contacts to carbon nanotubes (CNTs).

While there exist approaches to making p-type end-bonded contacts to CNTs, methods of making devices and devices incorporating robust n-type end-bonded contacts to CNTs are needed. Embodiments of the present invention relate to a method of forming robust n-type end-bonded metal contacts to CNTs by depositing a passivation layer on originally p-type contacts. The passivation layer functions as an n-type physicochemical doping layer.

It is to be understood that the various layers and/or regions shown in the accompanying drawings are not drawn to scale, and that one or more layers and/or regions of a type commonly used in complementary metal-oxide semiconductor (CMOS), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require CMOSs, MOSFETs and/or other types of FETs. By way of non-limiting example, the semiconductor devices can include, but are not limited to CMOS and MOSFET devices, and/or semiconductor devices that use CMOS and MOSFET technology.

As used herein, "height" refers to a vertical size of an element (e.g., a layer, trench, hole, etc.) in the cross-sectional views measured from a bottom surface to a top surface of the element, and/or measured with respect to a surface on which the element is directly on. Conversely, a "depth" refers to a vertical size of an element (e.g., a layer, trench, hole, etc.) in the cross-sectional and three-dimensional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to a substrate in the cross-sectional views, and "horizontal" refers to a direction parallel to a substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

FIG. 1 is a cross-sectional view illustrating a carbon nanotube (CNT) layer on a dielectric layer on a substrate in a method for manufacturing a semiconductor device, according to an exemplary embodiment of the present invention. Referring to FIG. 1, the semiconductor device includes a substrate 102 with a dielectric layer 104 formed on the substrate 102. The substrate can be, for example, a silicon, a silicon germanium, or any other substrate, and can include dopants such as p-type dopants, including, but not necessarily limited to, boron, n-type dopants, including, but not necessarily limited to, phosphorus, or any combination thereof. Non-limiting examples of the substrate 102 materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), or any combination thereof.

The dielectric layer 104 can be deposited on the substrate 102 using deposition techniques, including, but not necessarily limited to, chemical vapor deposition (CVD), plasma-enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), and/or liquid source misted chemical deposition (LSMCD), sputtering, and/or plating. The dielectric layer 104 can be formed of a high-k gate dielectric. In some aspects, the dielectric layer can include a low-k dielectric oxide, including but not limited to, spin-on-glass, a flowable oxide, a high density plasma oxide, or any combination thereof. Additionally, the dielectric layer 104 can be silicon dioxide, tetraethylorthosilicate (TEOS) oxide, high aspect ratio plasma (HARP) oxide, silicon oxide, high temperature oxide (HTO), high density plasma (HDP) oxide, oxides formed by an ALD process, or any combination thereof, and insulating liners, for example, silicon nitride (SiN), SiOCN, or SiBCN.

The substrate 102 can have a height of, for example, about 100 microns ($\mu$m) to about 500 microns ($\mu$m) from a bottom surface to a top surface of the substrate 102. The dielectric layer 104 can have a height of about 2 nanometers (nm) to about 300 nanometers (nm) from a bottom surface to a top surface of the dielectric layer 104.

FIG. 1 also illustrates a carbon nanotube (CNT) layer 106 disposed on the dielectric layer 104. The CNT layer 106 can include, but is not necessarily limited to, highly-purified carbon nanotube materials with various densities, and can be formed by drop casting a CNT solution on the dielectric layer 104. Alternatively, the CNT layer 106 can be formed by aligning or growing CNTs on the dielectric layer 104. Alternatively, according to an embodiment, a plurality of CNT layers that are spaced apart from each other in the horizontal direction can be formed on the dielectric layer 104, instead of a continuous CNT layer 106 as shown.

Figure 2:
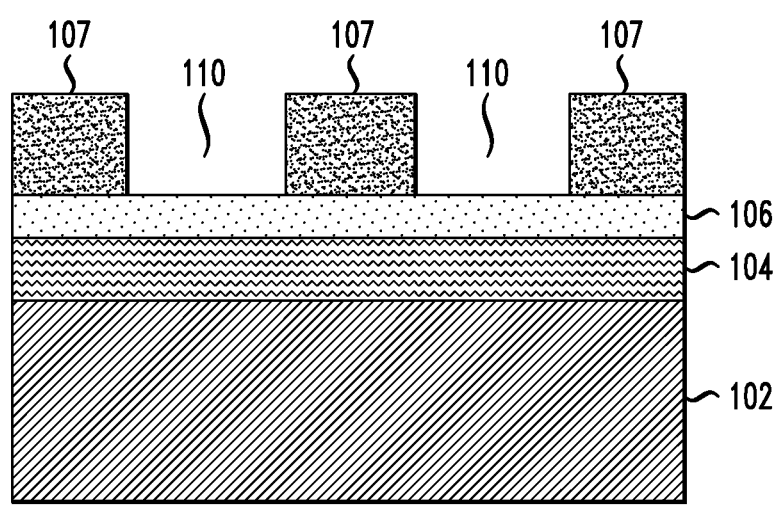
FIG. 2 is a cross-sectional view illustrating a dielectric layer formed on a CNT layer, and trenches formed in the dielectric layer, in a method for manufacturing a semiconductor device, according to an exemplary embodiment of the present invention.

FIG. 2 is a cross-sectional view illustrating a dielectric layer formed on the CNT layer, and trenches formed in the dielectric layer, in a method for manufacturing a semiconductor device, according to an exemplary embodiment of the present invention. Referring to FIG. 2, a dielectric layer 107 comprising, for example, hydrogen silsesquioxane (HSQ), is deposited on the CNT layer 106 and a portion of the dielectric layer 104 using any suitable method including, but not necessarily limited to, PECVD, ALD, or spin-coating and baking onto the underlying layer(s). The dielectric layer 107 protects portions of the device, including the CNT layer 106, when, for example, depositing subsequent layers on the device.

According to an embodiment of the present invention, portions of the dielectric layer 107 are removed using electron beam (e-beam) lithography to expose portions of the underlying CNT layer 106 in desired areas, forming trenches 110 where source/drain contact regions will be formed. Alternatively, a suitable etching process, such as, for example, isotropic or anisotropic etches, such as reactive ion etching (RIE), can be used to pattern the trenches 110.

Figure 3:
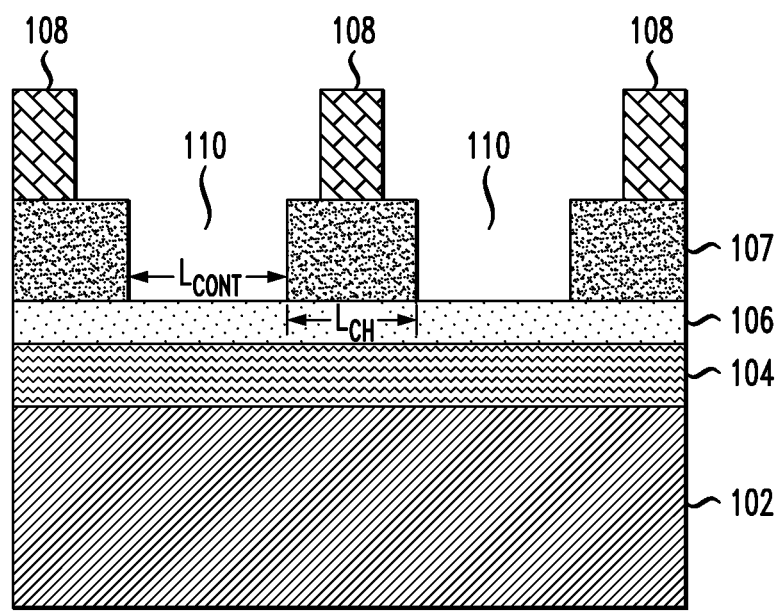
FIG. 3 is a cross-sectional view illustrating a patterned resist layer formed on the dielectric layer, in a method for manufacturing a semiconductor device, according to an exemplary embodiment of the present invention.

Referring to FIG. 3, according to embodiments of the present invention, the trenches 110 can have a contact length ($L_{cont}$) of about 5 nanometers (nm) to about 1000 nanometers (nm), such as, about 10 nanometers (nm) to about 100 nanometers (nm), but not necessarily limited thereto. As shown, more than one trench 110 can be formed. For example, multiple trenches 110 that are spaced apart from each other are illustrated at different portions of the CNT layer 106. The embodiments of the present invention are not limited to the illustrated number of trenches 110, and may include more or less trenches. According to an embodiment, a distance between each trench, or channel length ($L_{ch}$), can be, but is not necessarily limited to, about 5 nanometers (nm) to about 1000 nanometers (nm), such as, about 10 nanometers (nm) to about 150 nanometers (nm).

FIG. 3 is a cross-sectional view illustrating a resist 108 formed on portions of the dielectric layer 107, in a method for manufacturing a semiconductor device, according to an exemplary embodiment of the present invention. The resist 108 masks portions of the dielectric layer 107 when forming contact metal layers on the device. In accordance with an embodiment of the present invention, the resist 108 can be about 50 nanometers (nm) to about 1000 nanometers (nm) in height from a bottom surface to a top surface of the resist 108. The resist layer 108 can be deposited by any suitable method depending on the type of material, the methods including, but not necessarily limited to, PECVD, ALD, or spin-coating and baking onto the underlying layer(s).

In order to form the configuration shown in FIG. 3, portions of the resist 108 can be selectively removed by, for example, using electron beam lithography processing steps. For example, the resist 108 can be a polymethyl methacrylate (PMMA) resist, which is moldable and removable using electron beam lithography, but any other suitable resist can be used. According to embodiments of the present invention, the resist 108 can include, but is not necessarily limited to, a photoresist, electron-beam resist, ion-beam resist, X-ray resist, and an etchant resist, and may comprise polymeric spin-on or polymeric materials.

Figure 4:
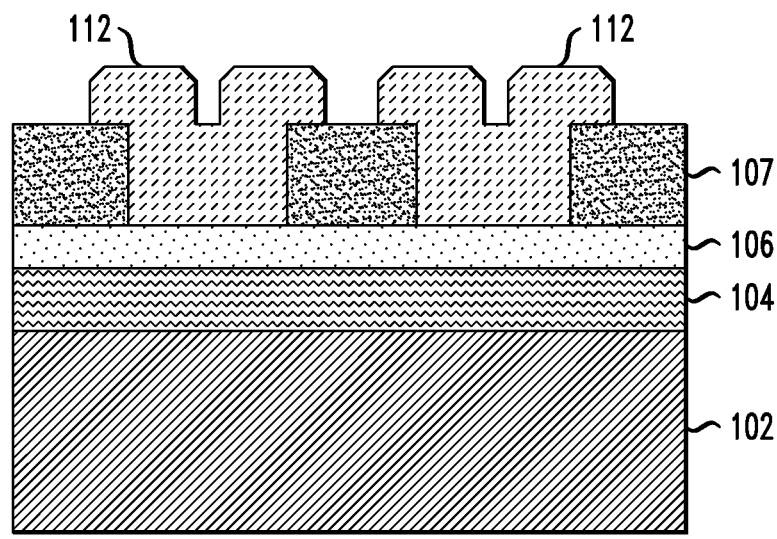
FIG. 4 is a cross-sectional view illustrating contact metal formation, in a method for manufacturing a semiconductor device, according to an exemplary embodiment of the present invention.

FIG. 4 is a cross-sectional view illustrating contact metal formation, in a method for manufacturing a semiconductor device, according to an exemplary embodiment of the present invention. Referring to FIG. 4, contact metal layers 112 are deposited between the remaining portions of the resist 108 and the dielectric layer 107 in the trenches 110 using, for example, a suitable deposition technique, such as, for example, CVD, PECVD, RFCVD, PVD, ALD, MLD, MBD, PLD, and/or LSMCD, sputtering, and/or plating. As shown in FIG. 4, following deposition of the contact metal 112, the resist 108 can be removed, or lifted off, from the dielectric layer 107 using, for example any suitable method of removing the resist 108 including, but not necessarily limited to, e-beam lithography, ashing and isopropyl alcohol (IPA) processing.

In some aspects, acetone, for example, hot acetone at a temperature of about 60° C.-about 80° C. can be used to lift-off the remaining resist 108. Additionally, in some aspects, the contact metal 112 can be planarized prior to or after removal of the resist 108. Planarization can be performed using, for example, chemical mechanical planarization (CMP).

Figure 5:
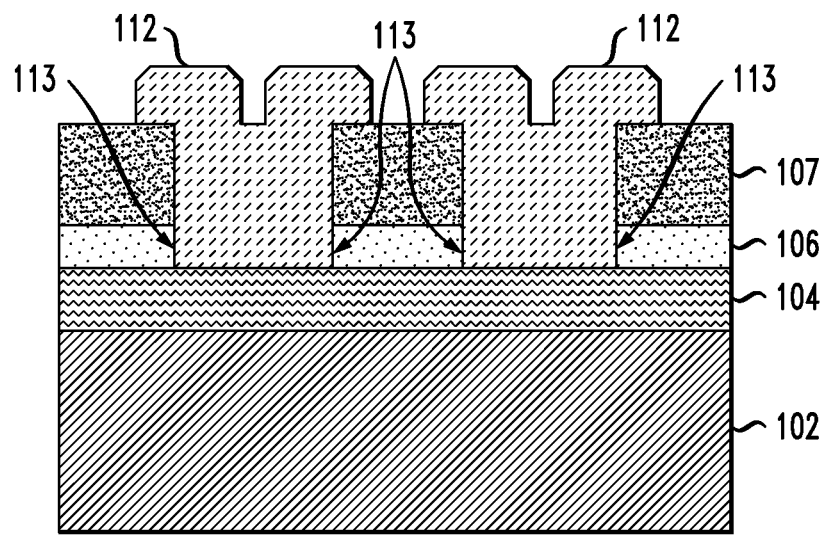
FIG. 5 is a cross-sectional view illustrating formation of end-bonded contacts following a thermal annealing process, in a method for manufacturing a semiconductor device, according to an exemplary embodiment of the present invention.

FIG. 5 is a cross-sectional view illustrating formation of end-bonded contacts following a thermal annealing process, in a method for manufacturing a semiconductor device, according to an exemplary embodiment of the present invention. Once the contacts 112 are deposited and the resist 108 is removed, a thermal annealing process is performed at a pre-determined temperature or temperature range to create end-bonds between the contacts 112 and the CNT layer 106 on which they are formed. As shown in FIG. 5, the thermal annealing process drives the CNT material to migrate or diffuse into the metal contacts 112, thereby creating an end-bonded contact 112 with contact interface surfaces 113 between a contact 112 and the CNT layer 106 only at ends of the contact 112 on lateral sides of the contacts 112. For example, according to an embodiment of the present invention, the carbon nanotubes that were beneath the contacts 112 are entirely dissolved into the contacts 112. The carbon nanotubes, which have a small diameter (e.g., ~1 nm), dissolve into contacts 112 having much larger dimensions relative to the carbon nanotubes to form end-bonded contacts.

The contacts 112, which function as source/drain contacts between channel regions for resulting transistors of the device, can be formed of any suitable metal. In some aspects, the contact metal has a sufficiently high solubility of carbon such that the CNT can dissolve into the metal contact during a thermal annealing process. In particular, the contact metal can be a metal that has a sufficiently high solubility of carbon such that the CNT can dissolve into the metal contact during a relatively low-temperature thermal annealing.

Additionally, the metal can be selected such that the metal does not form a carbide at relatively low thermal annealing temperatures. Specifically, thermal annealing steps are traditionally performed at high temperatures (such as greater than about 1000° C.) and relatively low thermal annealing temperatures are sought in order to lower the risk of damaging devices with the high temperatures. As such, in some aspects, the contact metal can be selected such that no carbides are formed during a thermal annealing process at a desired temperature of less than about 1000° C. By way of non-limiting example, a metal can be selected that does not form a carbide at a thermal annealing temperature of about 400° C. to about 600° C. Accordingly, the contact metal will form end-bonded metal contacts near the original contact edge and will not form a carbide contact surface.

A metal that has high CNT solubility and resists carbide formation at relatively low temperatures (e.g., about 400° C. to about 600° C.) can be used to form the contacts 112. In some aspects, the contacts 112 may comprise any of nickel (Ni), cobalt (Co), iron (Fe), copper (Cu), gold (Au), silver (Ag), ruthenium (Ru), palladium (Pd), platinum (Pt), iridium (Ir), and any mixtures or alloys thereof. For example, according to non-limiting embodiments of the present invention, the metal for the contacts 112 can be cobalt. A contact length (Loin) of the metal contacts 112 can be, for example, about 40 nm, but is not necessarily limited thereto. According to a non-limiting embodiment, the cobalt contacts are annealed at about 600° C. for about 5 minutes.

Figure 6:
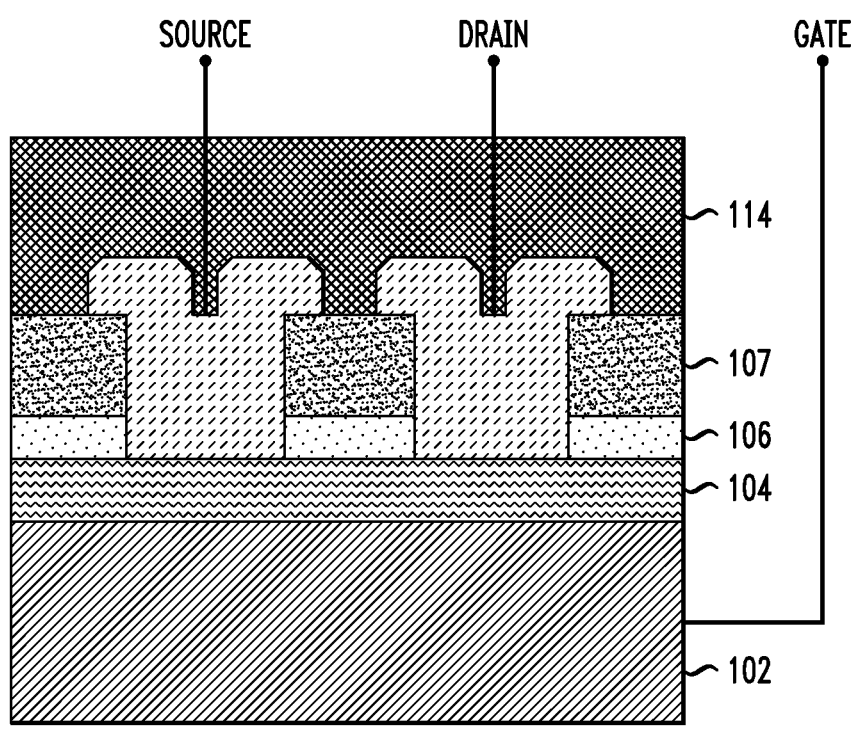
FIG. 6 is a cross-sectional view illustrating deposition of a passivation layer in a method for manufacturing a semiconductor device, according to an exemplary embodiment of the present invention.

FIG. 6 is a cross-sectional view illustrating deposition of a passivation layer in a method for manufacturing a semiconductor device, according to an exemplary embodiment of the present invention. Referring to FIG. 6, a passivation layer 114 is deposited on the contacts 112 and the dielectric layer 107. The passivation layer 114 is deposited using, for example, a suitable deposition technique, such as, for example, CVD, PECVD, RFCVD, PVD, ALD, MLD, MBD, PLD, and/or LSMCD, sputtering, and/or plating. The deposition technique may depend on the material used for the passivation layer 114. According to an embodiment of the present invention, the passivation layer 114 comprises a dielectric, such as, for example, an oxide or a nitride. For example, the passivation layer 114 includes, but is not necessarily limited to, aluminum oxide ($Al_2O_3$) or hafnium oxide ($HfO_2$) deposited using ALD. A height of the passivation layer 114 from a bottom surface to a top surface thereof can be in the range of about 5 nm to about 100 nm, for example, about 20 nm, depending on the height of the contacts 112 to allow a top surface of the passivation layer 114 to be higher than a top surface of the contacts 112. The passivation layer 114 functions as an n-type physicochemical doping layer and enables the formation of robust n-type metal contacts end-bonded to CNTs by converting p-type contacts 112 to n-type contacts.

After deposition of the passivation layer 114, for the convenience of electrical probing and measurement, the contact pad (e.g., non-device) area may be opened by wet etching to selectively remove the passivation layer 114.

Figure 7B:
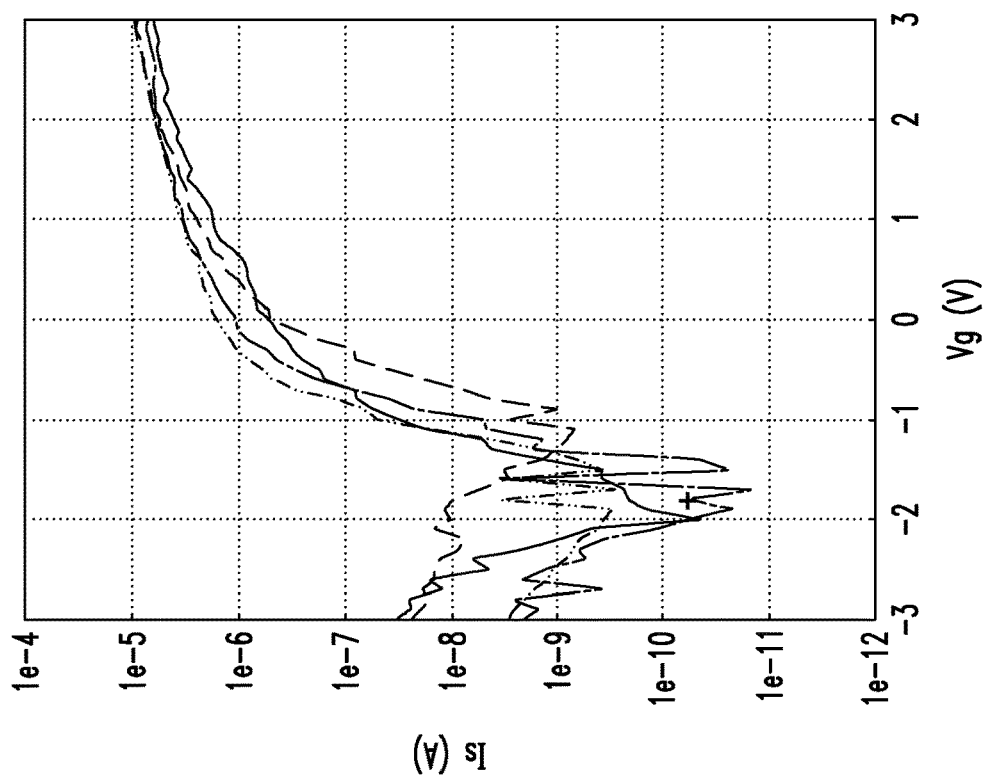
FIGS. 7A and 7B show graphs of source/drain current versus gate voltage of several CNT transistors in connection with end-bonded metal contacts without the passivation layer and with the passivation layer, according to an exemplary embodiment of the present invention.
Figure 7A:
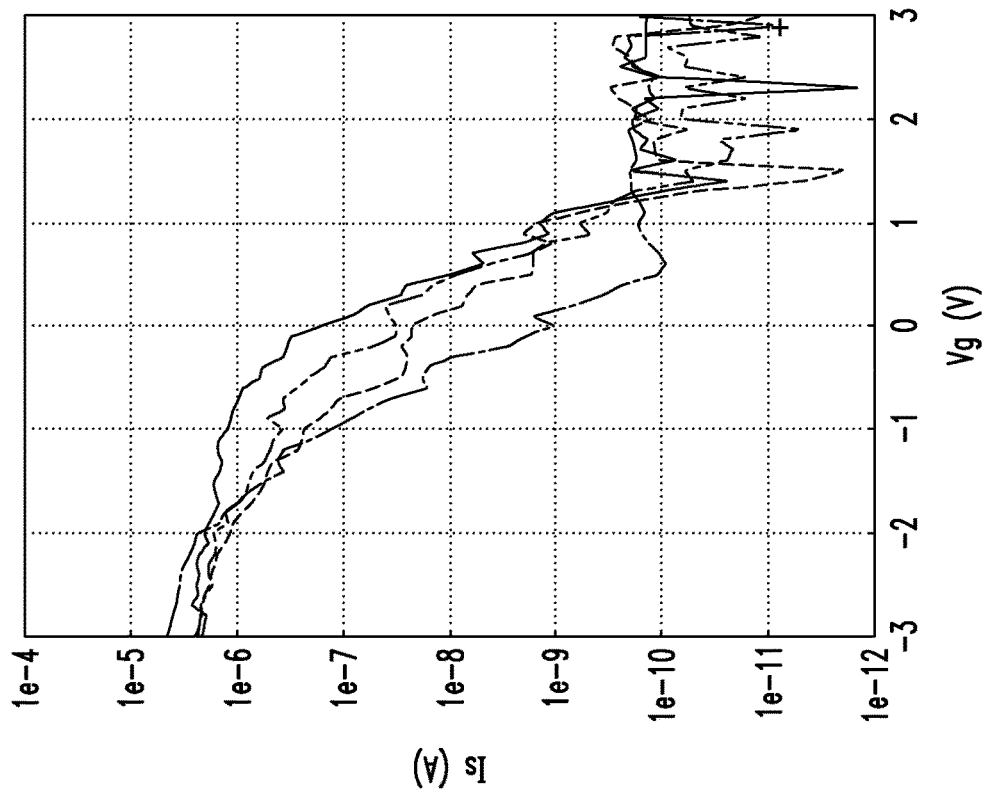

FIGS. 7A and 7B show graphs of source/drain current versus gate voltage in connection with end-bonded metal contacts without the passivation layer and with the passivation layer, according to an exemplary embodiment of the present invention. As can be seen in a comparison of FIGS. 7A and 7B, CNT transistors without a passivation layer (e.g., passivation layer 114) deposited thereon exhibit substantially complementary profiles to CNT transistors with a passivation layer due to the difference in doping (e.g., p-type vs. n-type) between the sets of transistors represented in FIGS. 7A and 7B.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a first dielectric layer on a substrate;
   forming a carbon nanotube (CNT) layer on the first dielectric layer, wherein a diameter of the carbon nanotube (CNT) layer is about 1 nanometer;
   forming a second dielectric layer on the carbon nanotube (CNT) layer, wherein the second dielectric layer comprises hydrogen silsesquioxane (HSQ);
   patterning a plurality of trenches in the second dielectric layer exposing corresponding first portions of the carbon nanotube (CNT) layer;
   forming a plurality of contacts on top of the patterned second dielectric layer and respectively in the plurality of trenches on the exposed first portions of the carbon nanotube (CNT) layer;
   wherein the plurality of contacts comprise cobalt;
   wherein a contact length of each of the plurality of contacts is about 10 nanometers to about 100 nanometers;
   performing a thermal annealing process to create end-bonds;
   wherein the thermal annealing process is performed at a temperature of about 400° C. to about 600° C.,
   wherein the thermal annealing process modifies the plurality of contacts;
   wherein the end-bonds are formed between second portions of the carbon nanotube (CNT) layer under the patterned second dielectric layer and bottom portions of the modified plurality of contacts on the first dielectric layer; and
   depositing a passivation layer on the plurality of modified contacts and the patterned second dielectric layer;
   wherein the modified plurality of contacts are on the first dielectric layer.

2. The method according to claim 1, wherein the passivation layer comprises aluminum oxide ($Al_2O_3$).

3. The method according to claim 2, wherein the passivation layer is deposited using atomic layer deposition (ALD).

4. The method according to claim 1, further comprising depositing a resist on the second dielectric layer prior to forming the plurality of contacts.

5. The method according to claim 4, wherein the resist comprises polymethyl methacrylate (PMMA).

6. The method according to claim 4, further comprising patterning the resist using electron beam lithography.

7. The method according to claim 6, wherein the plurality of contacts are formed on the top of the patterned second dielectric layer between remaining portions of the resist after the patterning of the resist.

8. The method according to claim 1, wherein:
   the contact length of each of the plurality of contacts is about 40 nm; and
   the contact length is equal to a width of a corresponding trench of the plurality of trenches in which a contact of the plurality of contacts is formed.

9. The method according to claim 1, wherein the patterned second dielectric layer is positioned between the modified plurality of contacts and the second portions of the carbon nanotube (CNT) layer.

10. The method according to claim 1, wherein a bottom surface of the patterned second dielectric layer contacts the carbon nanotube (CNT) layer.

11. A method for manufacturing a semiconductor device, comprising:
   forming a first dielectric layer on a substrate;
   forming a carbon nanotube (CNT) layer on the first dielectric layer, wherein a diameter of the carbon nanotube (CNT) layer is about 1 nanometer;
   forming a second dielectric layer on the carbon nanotube (CNT) layer, wherein the second dielectric layer comprises hydrogen silsesquioxane (HSQ);

patterning a plurality of trenches in the second dielectric layer exposing corresponding first portions of the carbon nanotube (CNT) layer;

forming a plurality of contacts on top of the patterned second dielectric layer and respectively in the plurality of trenches on the exposed first portions of the carbon nanotube (CNT) layer;

wherein the plurality of contacts comprise cobalt;

wherein a contact length of each of the plurality of contacts is about 10 nanometers to about 100 nanometers;

performing a thermal annealing process to create end-bonds;

wherein the thermal annealing process is performed at a temperature of about 400° C. to about 600° C., wherein the thermal annealing process modifies the plurality of contacts;

wherein the end-bonds are formed between second portions of the carbon nanotube (CNT) layer under the patterned second dielectric layer and portions of the modified plurality of contacts on the first dielectric layer; and depositing a passivation layer on the modified plurality of contacts and the patterned second dielectric layer;

wherein the modified plurality of contacts are on the first dielectric layer.

12. The method according to claim 11, wherein the passivation layer comprises aluminum oxide ($Al_2O_3$).

13. The method according to claim 11, wherein the patterned second dielectric layer is positioned between the modified plurality of contacts and the second portions of the carbon nanotube (CNT) layer.

14. The method according to claim 11, wherein a bottom surface of the patterned second dielectric layer contacts the carbon nanotube (CNT) layer.

* * * * *